United States Patent
Chen et al.

(10) Patent No.: US 10,283,580 B2
(45) Date of Patent: May 7, 2019

(54) DISPLAY DEVICE

(71) Applicants: Yang-Chen Chen, Miao-Li County (TW); Yu-Hsien Wu, Miao-Li County (TW)

(72) Inventors: Yang-Chen Chen, Miao-Li County (TW); Yu-Hsien Wu, Miao-Li County (TW)

(*) Notice: Subject to any disclaimer, the term of this patent is extended or adjusted under 35 U.S.C. 154(b) by 0 days.

(21) Appl. No.: 15/841,292

(22) Filed: Dec. 14, 2017

(65) Prior Publication Data

US 2018/0197934 A1    Jul. 12, 2018

(30) Foreign Application Priority Data

Jan. 10, 2017    (CN) .......................... 2017 1 0018650

(51) Int. Cl.

| | |
|---|---|
| *H01L 27/32* | (2006.01) |
| *G09G 3/32* | (2016.01) |
| *H01L 49/02* | (2006.01) |
| *H01L 25/16* | (2006.01) |
| *G09G 3/3233* | (2016.01) |
| *H01L 27/12* | (2006.01) |
| *H01L 25/075* | (2006.01) |

(52) U.S. Cl.
CPC .......... *H01L 27/3276* (2013.01); *G09G 3/32* (2013.01); *G09G 3/3233* (2013.01); *H01L 25/167* (2013.01); *H01L 27/3213* (2013.01); *H01L 27/3262* (2013.01); *H01L 27/3265* (2013.01); *H01L 28/40* (2013.01); *G09G 2300/0809* (2013.01); *G09G 2310/0251* (2013.01); *G09G 2310/0262* (2013.01); *G09G 2310/061* (2013.01); *H01L 25/0753* (2013.01); *H01L 27/124* (2013.01); *H01L 27/1251* (2013.01); *H01L 27/1255* (2013.01)

(58) Field of Classification Search
CPC ...................... H01L 27/3213; G09G 2310/061
See application file for complete search history.

(56) References Cited

U.S. PATENT DOCUMENTS

| | | | |
|---|---|---|---|
| 2010/0079651 A1* | 4/2010 | Lim | .................. H01L 27/14603 348/308 |
| 2010/0177125 A1* | 7/2010 | Miwa | .................. G09G 3/3233 345/690 |
| 2015/0123885 A1 | 5/2015 | Adachi | |

\* cited by examiner

*Primary Examiner* — Jay C Chang
*Assistant Examiner* — Mikka Liu
(74) *Attorney, Agent, or Firm* — JCIPRNET

(57) ABSTRACT

A display device including a substrate, a drive signal line, a first sub-pixel unit, and a second sub-pixel unit is provided. The first sub-pixel unit includes a first light-emitting unit, a first drive transistor, and a first reset transistor, wherein the first reset transistor has a first channel region and is electrically connected to the first light-emitting unit and the first drive transistor. The second sub-pixel unit includes a second light-emitting unit, a second drive transistor, and a second reset transistor, wherein the second reset transistor has a second channel region and is electrically connected to the second light-emitting unit and the second drive transistor, and the width of the first channel region is different from the width of the second channel region.

12 Claims, 3 Drawing Sheets

DISPLAY DEVICE

CROSS-REFERENCE TO RELATED APPLICATION

This application claims the priority benefit of China application serial no. 201710018650.2, filed on Jan. 10, 2017. The entirety of the above-mentioned patent application is hereby incorporated by reference herein and made a part of this specification.

BACKGROUND

Field of the Disclosure

The disclosure relates to a device, and more particularly, to a display device.

Description of Related Art

In recent years, with the advance in electronic product development technology and increasingly widespread application thereof, the demand for displays having a small size and low power consumption is increasing. Among displays, the LED display has features such as self-light emission, high brightness, wide viewing angle, and high reaction speed, and therefore the LED display has become one of the choices for next generation displays. The development of an LED display having high luminous efficiency is one of the main trends of current display technology.

SUMMARY

A display device of the disclosure includes a substrate, a drive signal line, a first sub-pixel unit, and a second sub-pixel unit. The drive signal line, the first sub-pixel unit, and the second sub-pixel unit are disposed on the substrate. The first sub-pixel unit includes a first light-emitting unit, a first drive transistor, and a first reset transistor, wherein the first drive transistor is electrically connected to the drive signal line and the first light-emitting unit, and the first reset transistor has a first channel region and is electrically connected to the first light-emitting unit and the first drive transistor. The second sub-pixel unit includes a second light-emitting unit, a second drive transistor, and a second reset transistor, wherein the second drive transistor is electrically connected to the drive signal line and the second light-emitting unit, the second reset transistor has a second channel region and is electrically connected to the second light-emitting unit and the second drive transistor, and the width of the first channel region is different from the width of the second channel region.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
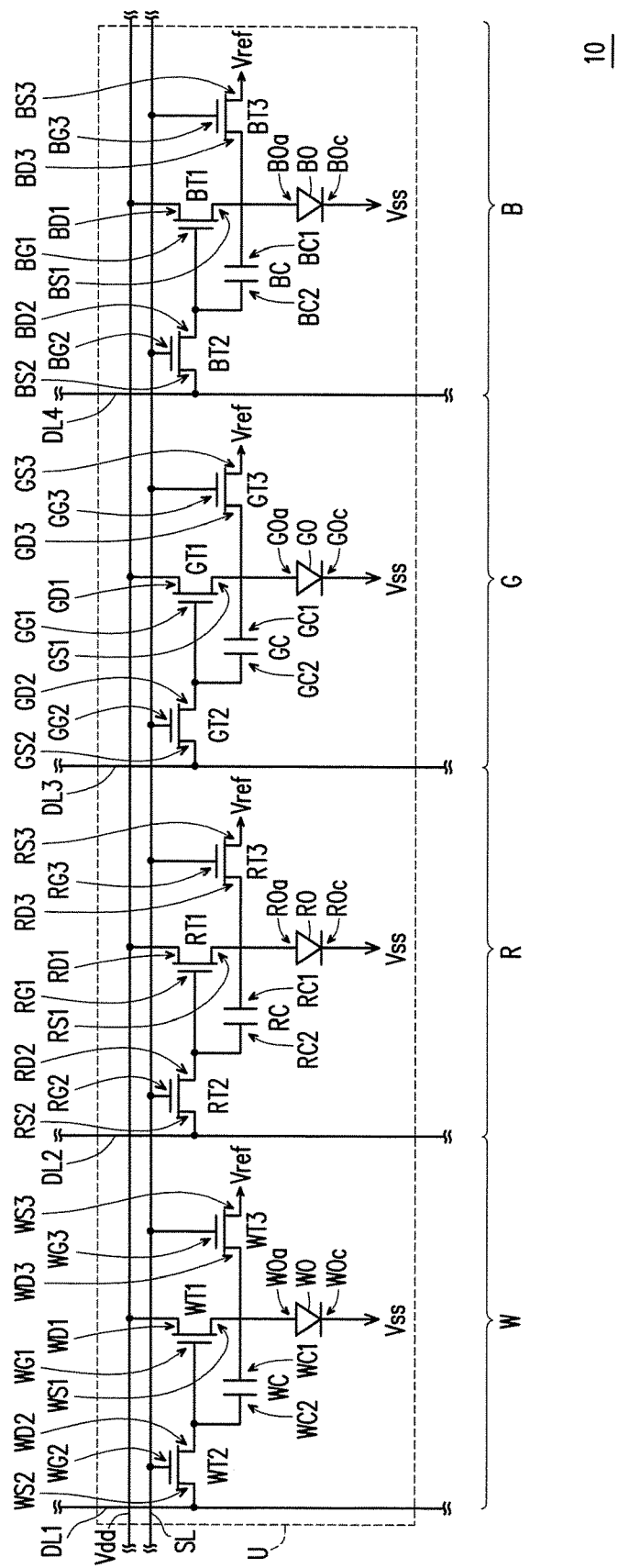
FIG. 1 is a local circuit diagram of a display device of an embodiment of the disclosure.

In the present specification, wherever possible, the same reference numerals are used in the drawings and descriptions to represent the same or similar portions.

In the disclosure, when a certain layer is disposed "on" other layers, the certain layer may be "directly" on the other layers, or the certain layer is "indirectly" on the other layers, i.e., at least one layer is disposed between the certain layer and the other layers.

In the disclosure, a certain error can exist between any two competing values or directions. If a first value is equal to a second value, then the first value and the second value may have a 10% error; if a first direction is perpendicular to a second direction, then the angle between the first direction and the second direction can be between 80 degrees and 100 degrees; and if the first direction is parallel to the second direction, then the angle between the first direction and the second direction can be between 0 degrees and 10 degrees.

In the disclosure, for ease of understanding, the locations of the source and the drain of the transistors in the figures are exemplary, and the disclosure is not limited thereto. This is because the source and the drain of the transistors are changed with the direction of the current, or are different based on whether the transistors are N-type metal-oxide-semiconductor (NMOS) transistors or P-type metal-oxide-semiconductor (PMOS) transistors.

In the following, the display device of the disclosure is specifically described via embodiments as examples of actual implementation of the disclosure, but the disclosure is not limited thereto.

Figure 2:
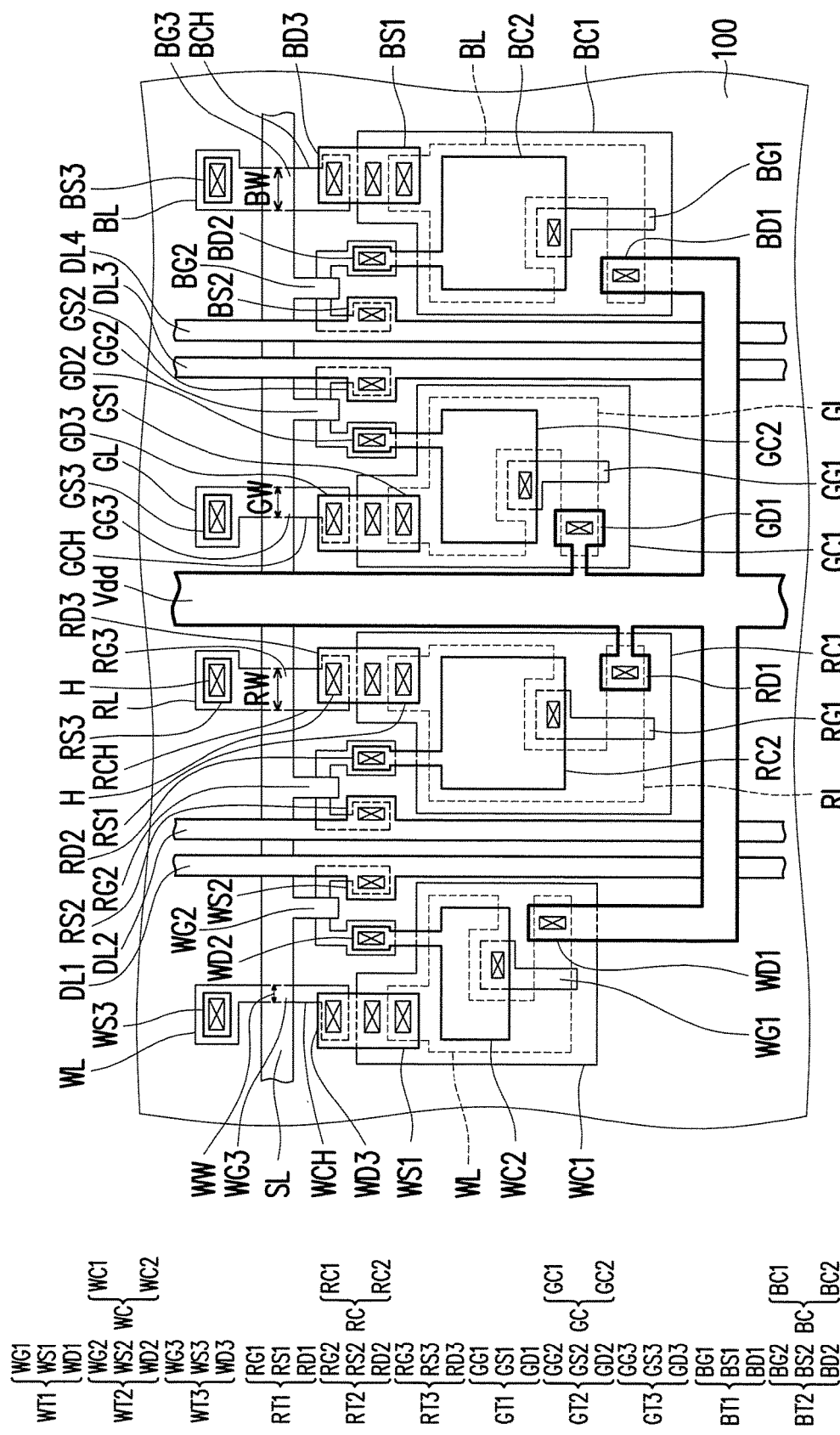
FIG. 2 is a top view of a portion of the structure of a display device of an embodiment of the disclosure.

FIG. 1 is a local circuit diagram of a display device of an embodiment of the disclosure. FIG. 2 is a top view of a portion of the structure of a display device of an embodiment of the disclosure. It should be mentioned that, the content disclosed in FIG. 1 and FIG. 2 are respectively only one of the circuit layouts and one of the structures of the display device of the disclosure, and the disclosure is not limited thereto. In practice, the layout method of the display device can be changed by the disposition of internal devices or the connection relationship between signal lines.

Referring to both FIG. 1 and FIG. 2, in the present embodiment, a display device 10 includes a substrate 100, a drive signal line Vdd, and a plurality of pixel units U. One pixel unit U includes a sub-pixel unit R, a sub-pixel unit G, a sub-pixel unit B, and a sub-pixel unit W. Moreover, in the present embodiment, the display device 10 further includes a scan line SL and data lines DL1 to DL4. For ease of explanation, FIG. 1 only shows one pixel unit U, but those skilled in the art should understand that, a plurality of pixel units U in the display device 10 are generally arranged in an array. Moreover, similarly, for ease of explanation, FIG. 2 only shows some of the components in one pixel unit U. Moreover, in the present embodiment, although each pixel unit U includes the sub-pixel unit B, the sub-pixel unit G, the sub-pixel unit R, and the sub-pixel unit W, the disclosure is not limited thereto. In another embodiment of the disclosure, one pixel unit U can also include the sub-pixel unit R, the sub-pixel unit G, and the sub-pixel unit B and not include the sub-pixel unit W.

The material of the substrate 100 can be (but not limited to): glass, quartz, organic polymer, an opaque/reflective material (such as: a conductive material, metal, wafer, ceramic, or other suitable materials), other suitable materials, or a stack or combination of at least two of the above. If the material of the substrate 100 is organic polymer, then the substrate 100 can specifically be polyimide (PI), polyethylene terephthalate (PET), or polycarbonate (PC), but is not limited thereto.

The data lines DL1 to DL4 and the scan line SL are disposed on the substrate 100 and have different extending directions. Preferably, the extending direction of the data lines DL1 to DL4 is perpendicular to the extending direction of the scan line SL. Moreover, the data lines DL1 to DL4 and the scan line SL belong to different film layers. Considering conductivity, the data lines DL1 to DL4 and the scan line SL are generally metal materials. However, the disclosure is not limited thereto, and in other embodiments, the data lines DL1 to DL4 and the scan line SL can also include, for instance (but not limited to): other conductive materials such as alloy, nitride of metal materials, oxide of metal materials, or oxynitride of metal materials, or stacked layers or combinations of metal materials and the other conductive materials above.

The drive signal line Vdd is disposed on the substrate 100. In the present embodiment, the drive signal line Vdd is electrically connected to a high-level voltage source to provide a high-level voltage to the pixel unit U. The extending direction of the drive signal line Vdd is parallel to the extending direction of the data lines DL1 to DL4. However, the disclosure is not limited thereto.

The sub-pixel unit W, the sub-pixel unit R, the sub-pixel unit G, and the sub-pixel unit B are disposed on the substrate 100. Specifically, in the present embodiment, the sub-pixel unit W includes a light-emitting unit WO, a drive transistor WT1, and a reset transistor WT3; the sub-pixel unit R includes a light-emitting unit RO, a drive transistor RT1, and a reset transistor RT3; the sub-pixel unit G includes a light-emitting unit GO, a drive transistor GT1, and a reset transistor GT31; and the sub-pixel unit B includes a light-emitting unit BO, a drive transistor BT1, and a reset transistor BT3. Moreover, in the present embodiment, the sub-pixel unit W further includes a switch transistor WT2 and a storage capacitor WC; the sub-pixel unit R further includes a switch transistor RT2 and a storage capacitor RC; the sub-pixel unit G further includes a switch transistor GT2 and a storage capacitor GC; and the sub-pixel unit B further includes a switch transistor BT2 and a storage capacitor BC. In other words, in the present embodiment, the sub-pixel unit W, the sub-pixel unit R, and the sub-pixel unit G are all exemplified by a 3T1C structure, but the disclosure is not limited thereto. In other embodiments, the sub-pixel unit W, the sub-pixel unit R, the sub-pixel unit G, and the sub-pixel unit B can also have a 4T2C structure, a 6T1C structure, a 7T2C structure, or any possible structure. The transistors of the sub-pixel units of the disclosure can be NMOS transistors, PMOS transistors, or complementary metal-oxide-semiconductor (CMOS) transistors.

Moreover, in the present embodiment, the sub-pixel unit W is a white pixel unit, the sub-pixel unit R is a red sub-pixel unit, the sub-pixel unit G is a green sub-pixel unit, and the sub-pixel unit B is a blue sub-pixel unit. In other words, in the present embodiment, the sub-pixel unit W emits white light, the sub-pixel unit R emits red light, the sub-pixel unit G emits green light, and the sub-pixel unit B emits blue light. Moreover, in the present embodiment, the light-emitting units WO, RO, GO, and BO of the sub-pixel units W, R, G, and B all respectively emit the same colored lights such as white. In the light-emitting units WO, RO, GO, and BO, other than the light-emitting unit WO, the light-emitting units RO, GO, and BO are used with a red color resist, a green color resist, and a blue color resist to display various different colored lights. However, the disclosure is not limited thereto. In another embodiment of the disclosure, the light-emitting units WO, RO, GO, and BO each emit white light, red light, green light, and blue light and each are used without the color resist of each color. In yet another embodiment of the disclosure, the light-emitting units WO, RO, GO, and BO can each emit white light, red light, green light, and blue light and be used with the color resist of each color.

Moreover, in the present embodiment, the light-emitting unit WO, the light-emitting unit RO, the light-emitting unit GO, and the light-emitting unit BO are all OLEDs. In other words, in the present embodiment, the display device 10 is an OLED display device. However, in other embodiments, the light-emitting unit WO, the light-emitting unit RO, the light-emitting unit GO, and the light-emitting unit BO are micro-LEDs, such as flip-chip micro-LEDs or vertical micro-LEDs. As a result, the display device 10 is a micro LED display device.

Specifically, in the present embodiment, a gate WG2 of the switch transistor WT2 is electrically connected to the scan line SL; a source WS2 of the switch transistor WT2 is electrically connected to the data line DL1; a drain WD2 of the switch transistor WT2 is electrically connected to a gate WG1 of the drive transistor WT1; a drain WD1 of the drive transistor WT1 is electrically connected to the drive signal line Vdd to receive high-level voltage; an upper electrode WC2 of the storage capacitor WC is electrically connected to a gate WG1 of the drive transistor WT1; a lower electrode WC1 of the storage capacitor WC is electrically connected to a source WS1 of the drive transistor WT1; a drain WD3 of the reset transistor WT3 is electrically connected to the source WS1 of the drive transistor WT1; a gate WG3 of the reset transistor WT3 is electrically connected to the scan line SL; a source WS3 of the reset transistor WT3 is electrically connected to a reference voltage source Vref to receive a reference voltage; an anode WOa of the light-emitting unit WO is electrically connected to the source WS1 of the drive transistor WT1; and a cathode WOc of the light-emitting unit WO is electrically connected to a low-level voltage source Vss. In other words, in the present embodiment, the drive transistor WT1 is electrically connected to the drive signal line Vdd and the light-emitting unit WO; the reset transistor WT3 is electrically connected to the light-emitting unit WO and the drive transistor WT1; the storage capacitor WC is electrically connected to the light-emitting unit WO, the drive transistor WT1, and the reset transistor WT3; and the switch transistor WT2 is electrically connected to the drive transistor WT1 and the storage capacitor WC.

Similarly, in the present embodiment, a gate RG2 of the switch transistor RT2 is electrically connected to the scan line SL; a source RS2 of the switch transistor RT2 is electrically connected to the data line DL2; a drain RD2 of the switch transistor RT2 is electrically connected to a gate RG1 of the drive transistor RT1; a drain RD1 of the drive transistor RT1 is electrically connected to the drive signal line Vdd to receive high-level voltage; an upper electrode RC2 of the storage capacitor RC is electrically connected to the gate RG1 of the drive transistor RT1; a lower electrode RC1 of the storage capacitor RC is electrically connected to a source RS1 of the drive transistor RT1; a drain RD3 of the reset transistor RT3 is electrically connected to the source RS1 of the drive transistor RT1; a gate RG3 of the reset transistor RT3 is electrically connected to the scan line SL; a source RS3 of the reset transistor RT3 is electrically connected to the reference voltage source Vref to receive a reference voltage; an anode ROa of the light-emitting unit RO is electrically connected to the source RS1 of the drive transistor RT1; and a cathode ROc of the light-emitting unit RO is electrically connected to the low-level voltage source Vss. In other words, in the present embodiment, the drive transistor RT1 is electrically connected to the drive signal line Vdd and the light-emitting unit RO; the reset transistor RT3 is electrically connected to the light-emitting unit RO and the drive transistor RT1; the storage capacitor RC is electrically connected to the light-emitting unit RO, the drive transistor RT1, and the reset transistor RT3; and the switch transistor RT2 is electrically connected to the drive transistor RT1 and the storage capacitor RC.

Similarly, in the present embodiment, a gate GG2 of the switch transistor GT2 is electrically connected to the scan line SL; a source GS2 of the switch transistor GT2 is electrically connected to the data line DL3; a drain GD2 of the switch transistor GT2 is electrically connected to a gate GG1 of the drive transistor GT1; a drain GD1 of the drive transistor GT1 is electrically connected to the drive signal line Vdd to receive high-level voltage; an upper electrode GC2 of the storage capacitor GC is electrically connected to the gate GG1 of the drive transistor GT1; a lower electrode GC1 of the storage capacitor GC is electrically connected to a source GS1 of the drive transistor GT1; a drain GD3 of the reset transistor GT3 is electrically connected to the source GS1 of the drive transistor GT1; a gate GG3 of the reset transistor GT3 is electrically connected to the scan line SL; a source GS3 of the reset transistor GT3 is electrically connected to the reference voltage source Vref to receive a reference voltage; an anode GOa of the light-emitting unit GO is electrically connected to the source GS1 of the drive transistor GT1; and a cathode GOc of the light-emitting unit GO is electrically connected to the low-level voltage source Vss. In other words, in the present embodiment, the drive transistor GT1 is electrically connected to the drive signal line Vdd and the light-emitting unit GO; the reset transistor GT3 is electrically connected to the light-emitting unit GO and the drive transistor GT1; the storage capacitor GC is electrically connected to the light-emitting unit GO, the drive transistor GT1, and the reset transistor GT3; and the switch transistor GT2 is electrically connected to the drive transistor GT1 and the storage capacitor GC.

Similarly, in the present embodiment, a gate BG2 of the switch transistor BT2 is electrically connected to the scan line SL; a source BS2 of the switch transistor BT2 is electrically connected to the data line DL4; a drain BD2 of the switch transistor BT2 is electrically connected to a gate BG1 of the drive transistor BT1; a drain BD1 of the drive transistor BT1 is electrically connected to the drive signal line Vdd to receive high-level voltage; an upper electrode BC2 of the storage capacitor BC is electrically connected to the gate BG1 of the drive transistor BT1; a lower electrode BC1 of the storage capacitor BC is electrically connected to a source BS1 of the drive transistor BT1; a drain BD3 of the reset transistor BT3 is electrically connected to the source BS1 of the drive transistor BT1; a gate BG3 of the reset transistor BT3 is electrically connected to the scan line SL; a source BS3 of the reset transistor BT3 is electrically connected to the reference voltage source Vref to receive a reference voltage; an anode BOa of the light-emitting unit BO is electrically connected to the source BS1 of the drive transistor BT1; and a cathode BOc of the light-emitting unit BO is electrically connected to the low-level voltage source Vss. In other words, in the present embodiment, the drive transistor BT1 is electrically connected to the drive signal line Vdd and the light-emitting unit BO; the reset transistor BT3 is electrically connected to the light-emitting unit BO and the drive transistor BT1; the storage capacitor BC is electrically connected to the light-emitting unit BO, the drive transistor BT1, and the reset transistor BT3; and the switch transistor BT2 is electrically connected to the drive transistor BT1 and the storage capacitor BC.

In the present embodiment, the low-level voltage source Vss is grounded and the drive signal line Vdd provides a voltage greater than zero, and therefore the drive signal line Vdd has a voltage difference with the low-level voltage source Vss such that current flows from the anode of the light-emitting unit toward the cathode of the light-emitting unit. However, the disclosure is not limited thereto. In other embodiments, the low-level voltage source Vss provides a voltage greater than zero, but the level thereof is less than the voltage provided by the drive signal line Vdd, and current can also flow from the anode of the light-emitting unit to the cathode of the light-emitting unit.

Moreover, in the present embodiment, the area of the storage capacitor RC is greater than the area of the storage capacitor GC, the area of the storage capacitor RC is greater than the area of the storage capacitor WC, the area of the storage capacitor BC is greater than the area of the storage capacitor GC, the area of the storage capacitor BC is greater than the area of the storage capacitor WC, the area of the storage capacitor GC is greater than the area of the storage capacitor WC, and the area of the storage capacitor RC is substantially equal to the area of the storage capacitor BC. In other words, in the present embodiment, the areas of at least three of the storage capacitor WC, the storage capacitor RC, the storage capacitor GC, and the storage capacitor BC are different. It should be mentioned that, in the present specification, the area of the storage capacitor is defined as: the overlapped area of the upper electrode and the lower electrode of the storage capacitor. Using the storage capacitor RC as an example, the area of the storage capacitor RC is the overlapped area of the upper electrode RC2 and the lower electrode RC1. From another perspective, in the present embodiment, since the area of the upper electrode (upper electrodes WC2, RC2, GC2, and BC2) is less than that of the lower electrode (lower electrodes WC1, RC1, GC1, and BC1), the area of the storage capacitor can be regarded as the area of the upper electrode (upper electrodes WC2, RC2, GC2, and BC2).

It should be mentioned that, in the present embodiment, since the areas of at least three of the storage capacitor WC, the storage capacitor RC, the storage capacitor GC, and the storage capacitor BC are different, the sub-pixel unit W, the sub-pixel unit R, the sub-pixel unit G, and the sub-pixel unit B in the display device 10 can have similar luminous brightness. The reason is provided below.

In general, in comparison to the luminous efficiencies of the red sub-pixel unit and the blue sub-pixel unit, the luminous efficiencies of the green sub-pixel unit and the white sub-pixel unit are better. The luminous efficiency of the white sub-pixel unit is better than the luminous efficiency of the green sub-pixel unit. It should be mentioned that, the comparison of luminous efficiencies is only an example, and is not intended to limit the disclosure. Accordingly, in the present embodiment, the area of the storage capacitor RC is greater than the area of the storage capacitor GC, the area of the storage capacitor RC is greater than the area of the storage capacitor WC, the area of the storage capacitor BC is greater than the area of the storage capacitor GC, the area of the storage capacitor BC is greater than the area of the storage capacitor WC, or the area of the storage capacitor GC is greater than the area of the storage capacitor WC, and therefore in comparison to the storage capacitor GC and the storage capacitor WC, the storage capacitor RC and the storage capacitor BC can store a greater amount of charge; or in comparison to the storage capacitor WC, the storage capacitor GC can store a greater amount of charge, such that the sub-pixel unit W, the sub-pixel unit R, the sub-pixel unit G, and the sub-pixel unit B can have similar luminous brightness.

Moreover, in the present embodiment, the portions in a semiconductor layer WL corresponding to the source WS3 and the drain WD3 of the reset transistor WT3 are respectively the source doped region and the drain doped region of the reset transistor WT3, wherein the source WS3 and the drain WD3 of the reset transistor WT3 are respectively electrically connected to the source doped region and the drain doped region, and the portion in the semiconductor layer WL located between the source doped region and the drain doped region is a channel region WCH of the reset transistor WT3. In other words, in the present embodiment, the channel region WCH is located in the semiconductor layer WL.

Similarly, in the present embodiment, the portions in a semiconductor layer RL corresponding to the source RS3 and the drain RD3 of the reset transistor RT3 are respectively the source doped region and the drain doped region of the reset transistor RT3, wherein the source RS3 and the drain RD3 of the reset transistor RT3 are respectively electrically connected to the source doped region and the drain doped region, and the portion in the semiconductor layer RL located between the source doped region and the drain doped region is a channel region RCH of the reset transistor RT3. In other words, in the present embodiment, the channel region RCH is located in the semiconductor layer RL.

Similarly, in the present embodiment, the portions in a semiconductor layer GL corresponding to the source GS3 and the drain GD3 of the reset transistor GT3 are respectively the source doped region and the drain doped region of the reset transistor GT3, wherein the source GS3 and the drain GD3 of the reset transistor GT3 are respectively electrically connected to the source doped region and the drain doped region, and the portion in the semiconductor layer GL located between the source doped region and the drain doped region is a channel region GCH of the reset transistor GT3. In other words, in the present embodiment, the channel region GCH is located in the semiconductor layer GL.

Similarly, in the present embodiment, the portions in a semiconductor layer BL corresponding to the source BS3 and the drain BD3 of the reset transistor BT3 are respectively the source doped region and the drain doped region of the reset transistor BT3, wherein the source BS3 and the drain BD3 of the reset transistor BT3 are respectively electrically connected to the source doped region and the drain doped region, and the portion in the semiconductor layer BL located between the source doped region and the drain doped region is a channel region BCH of the reset transistor BT3. In other words, in the present embodiment, the channel region BCH is located in the semiconductor layer BL.

Moreover, in the present embodiment, the material of the semiconductor layer WL, the semiconductor layer RL, the semiconductor layer GL, and the semiconductor layer BL can include amorphous silicon, low-temperature polysilicon, a MOS material, or a combination thereof, but is not limited thereto. The MOS material includes, for instance (but is not limited to): indium-gallium-zinc oxide (IGZO), zinc oxide, tin oxide (SnO), indium-zinc oxide (IZO), gallium-zinc oxide (GZO), zinc-tin oxide (ZTO), or indium-tin oxide (ITO). In other embodiments, the semiconductor layer of a portion of the transistor can adopt polysilicon, and the semiconductor layer of another portion of the transistor can adopt a MOS material. However, the mixed state of the semiconductor layer is not limited thereto.

More specifically, in the present embodiment, a width RW of the channel region RCH is greater than a width GW of the channel region GCH, the width RW of the channel region RCH is greater than a width WW of the channel region WCH, a width BW of the channel region BCH is greater than the width GW of the channel region GCH, the width BW of the channel region BCH is greater than the width WW of the channel region WCH, the width GW of the channel region GCH is greater than the width WW of the channel region WCH, or the width RW of the channel region RCH is substantially equal to the width BW of the channel region BCH. However, the disclosure is not limited thereto. In another embodiment, the width RW of the channel region RCH can be greater than the width BW of the channel region BCH. In yet another embodiment, the width RW of the channel region RCH can be less than the width BW of the channel region BCH. In other words, in the present embodiment, the widths of at least three channel regions in the reset transistor WT3, the reset transistor RT3, the reset transistor GT3, and the reset transistor BT3 are different. For instance, in an embodiment, in the case that the size of the display device 10 is 65 inches, the width WW of the channel region WCH is 8 µm, the width RW of the channel region RCH is 13 µm, the width GW of the channel region GCH is 9 µm, and the width BW of the channel region BCH is 13 µm. However, the disclosure is not limited to the examples above.

It should be mentioned that, in the present embodiment, the widths of at least three channel regions in the reset transistor WT3, the reset transistor RT3, the reset transistor GT3, and the reset transistor BT3 are different, such that during the reset phase, the sub-pixel unit W, the sub-pixel unit R, the sub-pixel unit G, and the sub-pixel unit B in the pixel unit U can complete a reset operation during the reset phase. The reason is provided below.

In general, the operation process of the LED display includes four stages: a reset stage, a compensation stage, a data writing stage, and a light-emitting stage, wherein during the reset stage, the reset transistor is turned on to reset the voltage of the storage capacitor to the reference voltage. When the areas of the storage capacitors are different and the widths of the channel regions of the reset transistors are the same, the times of writing the reference voltage into the reset transistors and resetting the voltages of the storage capacitors to the reference voltage are different. Accordingly, in the present embodiment, the width RW of the channel region RCH is greater than the width GW of the channel region GCH, the width RW of the channel region RCH is greater than the width WW of the channel region WCH, the width BW of the channel region BCH is greater than the width GW of the channel region GCH, the width BW of the channel region BCH is greater than the width WW of the channel region WCH, or the width GW of the channel region GCH is greater than the width WW of the channel region WCH, and therefore in comparison to the reset transistor GT3 and the reset transistor WT3, the channel region RCH of the reset transistor RT3 or the channel region BCH of the reset transistor BT3 can allow a greater current from the reference voltage source Vref to pass through; or in comparison to the reset transistor WT3, the channel region GCH of the reset transistor GT3 can allow a greater current from the reference voltage source Vref to pass through, such that the sub-pixel unit W, the sub-pixel unit R, the sub-pixel unit G, and the sub-pixel unit B can complete a reset operation during the reset phase.

Moreover, in the present embodiment, the drive transistor WT1, the switch transistor WT2, the reset transistor WT3, the drive transistor RT1, the switch transistor RT2, the reset transistor RT3, the drive transistor GT1, the switch transistor GT2, the reset transistor GT3, the drive transistor BT1, the switch transistor BT2, and the reset transistor BT3 are exemplified as top gate structures. Specifically, as shown in FIG. 2, using the reset transistor RT3 as an example, the source RS3 and the drain RD3 of the reset transistor RT3 are respectively electrically connected to the source doped region and the drain doped region in the semiconductor layer WL via contacts H. However, the top gate structures exemplified above are only intended to facilitate understanding, and the transistors mentioned in the disclosure can also be bottom gate structures, and the combination of the top gate structures and the bottom gate structures is also a viable embodiment.

Moreover, in the embodiments of FIG. 1 and FIG. 2, although the pixel unit U includes four sub-pixel units (i.e., the sub-pixel unit W, the sub-pixel unit R, the sub-pixel unit G, and the sub-pixel unit B), the disclosure is not limited thereto. In other embodiments, the pixel unit U can also include three sub-pixel units. In an embodiment in which the pixel unit U includes the sub-pixel unit R, the sub-pixel unit G, and the sub-pixel unit B, as described above, since in comparison to the luminous efficiencies of the red sub-pixel unit and the blue sub-pixel unit, the luminous efficiency of the green sub-pixel unit is better, by making the area of the storage capacitor RC greater than the area of the storage capacitor GC or the area of the storage capacitor BC greater than the area of the storage capacitor GC, in comparison to the storage capacitor GC, the storage capacitor RC or the storage capacitor BC can store a greater amount of charge to achieve similar luminous brightness for the sub-pixel unit R, the sub-pixel unit G, and the sub-pixel unit B. In other words, in the display device 10 of the disclosure, since the areas of at least two of the storage capacitor RC, the storage capacitor GC, and the storage capacitor BC are different, the sub-pixel unit R, the sub-pixel unit G, and the sub-pixel unit B can have similar luminous brightness.

More specifically, in an embodiment in which the pixel unit U includes the sub-pixel unit R, the sub-pixel unit G, and the sub-pixel unit B, as described above, the width RW of the channel region RCH is greater than the width GW of the channel region GCH or the width BW of the channel region BCH is greater than the width GW of the channel region GCH, and therefore in comparison to the reset transistor GT3, the channel region RCH of the reset transistor RT3 or the channel region BCH of the reset transistor BT3 can allow a greater amount of current from the reference voltage source Vref to pass through, such that the sub-pixel unit R, the sub-pixel unit G, and the sub-pixel unit B for which the areas of the storage capacitors are not completely the same can complete a reset operation during the reset phase. In other words, in the display device 10 of the disclosure, since the widths of at least two channel regions in the reset transistor RT3, the reset transistor GT3, and the reset transistor BT3 are different, the sub-pixel unit R, the sub-pixel unit G, and the sub-pixel unit B can complete a reset operation during the reset phase.

Moreover, in the embodiments of FIG. 1 and FIG. 2, although the area of the storage capacitor RC is substantially equal to the area of the storage capacitor BC, the disclosure does not particularly limit the relationship between the area of the storage capacitor RC and the area of the storage capacitor BC. Therefore, based on actual product requirement, if the luminous efficiency of the red sub-pixel unit is better than the luminous efficiency of the blue sub-pixel unit, then the area of the storage capacitor RC can be designed to be less than the area of the storage capacitor BC; and if the luminous efficiency of the blue sub-pixel unit is better than the luminous efficiency of the red sub-pixel unit, then the area of the storage capacitor BC can be designed to be less than the area of the storage capacitor RC.

Similarly, in the present embodiment, although the width RW of the channel region RCH is substantially equal to the width BW of the channel region BCH, the disclosure does not particularly limit the relationship between the width RW and the width BW. Based on actual product requirements, the width RW of the channel region RCH can also be designed to be less than the width BW of the channel region BCH, or the width RW of the channel region RCH can also be designed to be greater than the width BW of the channel region BCH.

Based on the above, in the display device of the disclosure, since the widths of the channel regions of the reset transistors in at least two sub-pixel units are different, each sub-pixel unit can complete a reset operation during the reset phase.

Figure 3:
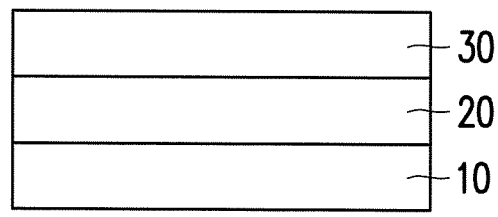
FIG. 3 is a schematic of a touch display device of an embodiment of the disclosure.
Figure 4:
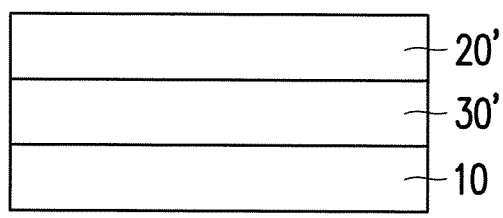
FIG. 4 is a schematic of a touch display device of another embodiment of the disclosure.

Although the disclosure is disclosed in the embodiments above, the various technical means described in each embodiment can be combined without conflicting one another. Moreover, the various embodiments of the disclosure can include various touch devices and can be applied in various electronic devices such as mobile phones, flat panels, notebook computers, and televisions. For instance, FIG. 3 is a schematic of a touch display device of an embodiment of the disclosure. Referring to FIG. 3, in the present embodiment, a touch display device 1 includes a display device 10, a protective cover 20, and a touch module 30, wherein the protective cover 20 is disposed on the display device 10, and the touch module 30 is disposed on the protective cover 20. The structure of FIG. 3 can be collectively referred to as an out-cell touch display device. FIG. 4 is a schematic of a touch display device of another embodiment of the disclosure. Referring to FIG. 4 and FIG. 3, the difference between the embodiment of FIG. 4 and the embodiment of FIG. 3 is: a touch module 30' of a touch display device 1' is disposed between a protective cover 20' and the display device 10, and the protective cover 20 of the touch display device 1 is disposed between the touch module 30 and the display device 10. The structure of FIG. 4 can be collectively referred to as an in-cell/on-cell touch display device. It should be known that, the touch modules 30 and 30' can be touch sensing layers. The touch module 30' can also be a touch sensing layer disposed on the substrate, and the substrate can be a sealing layer or a polarizing layer of the display device or a substrate for carrying a touch sensing layer. Alternatively, the touch modules 30 and 30' have pressure sensing function. Alternatively, the display device 10 combines the touch module 30, the touch module 30' and a pressure sensing module.

Although the disclosure has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A display device, comprising:
a substrate;
a drive signal line disposed on the substrate; and
a first sub-pixel unit disposed on the substrate, wherein the first sub-pixel unit comprises:
   a first light-emitting unit;
   a first drive transistor electrically connected to the drive signal line and the first light-emitting unit; and
   a first reset transistor having a first channel region, the first reset transistor electrically connected to the first light-emitting unit and the first drive transistor; and
a second sub-pixel unit disposed on the substrate, wherein the second sub-pixel unit comprises:
   a second light-emitting unit;
   a second drive transistor electrically connected to the drive signal line and the second light-emitting unit; and
   a second reset transistor having a second channel region, the second reset transistor electrically connected to the second light-emitting unit and the second drive transistor,
wherein a width of the second channel region is greater than a width of the first channel region, and
wherein the first sub-pixel unit further comprises a first storage capacitor electrically connected to the first light-emitting unit, the first drive transistor, and the first reset transistor, the second sub-pixel unit further comprises a second storage capacitor electrically connected to the second light-emitting unit, the second drive transistor, and the second reset transistor, and an area of an upper electrode of the second storage capacitor is greater than an area of an upper electrode of the first storage capacitor.

2. The display device of claim 1, wherein the first sub-pixel unit is a green sub-pixel unit and the second sub-pixel unit is a red sub-pixel unit.

3. The display device of claim 1, wherein the first sub-pixel unit is a white sub-pixel unit and the second sub-pixel unit is a red sub-pixel unit.

4. The display device of claim 1, wherein the first sub-pixel unit is a green sub-pixel unit and the second sub-pixel unit is a blue sub-pixel unit.

5. The display device of claim 1, wherein the first sub-pixel unit is a white sub-pixel unit and the second sub-pixel unit is a blue sub-pixel unit.

6. The display device of claim 1, wherein the first sub-pixel unit is a white sub-pixel unit and the second sub-pixel unit is a green sub-pixel unit.

7. The display device of claim 1, further comprising a third sub-pixel unit disposed on the substrate, wherein the third sub-pixel unit comprises a third reset transistor, the third reset transistor has a third channel region, and a width of the third channel region is greater than the width of the first channel region.

8. The display device of claim 7, wherein the third sub-pixel unit is a blue sub-pixel unit.

9. The display device of claim 7, further comprising a fourth sub-pixel unit disposed on the substrate, wherein the fourth sub-pixel unit comprises a fourth reset transistor, the fourth reset transistor has a fourth channel region, and a width of the fourth channel region is less than the width of the first channel region, the width of the second channel region, and the width of the third channel region.

10. The display device of claim 9, wherein the fourth sub-pixel unit is a white sub-pixel unit.

11. The display device of claim 1, wherein the first sub-pixel unit is a green sub-pixel unit and the second sub-pixel unit is a red sub-pixel unit.

12. The display device of claim 1, wherein the first sub-pixel unit is a green sub-pixel unit and the second sub-pixel unit is a blue sub-pixel unit.

* * * * *